United States Patent
Palla et al.

(10) Patent No.: US 8,707,220 B2
(45) Date of Patent: Apr. 22, 2014

(54) SEMICONDUCTOR MANUFACTURING OPTIMIZATION BY COMBINING SMALL LOTS INTO INDIVIDUAL CARRIERS

(71) Applicant: Texas Instruments Incorporated, Dallas, TX (US)

(72) Inventors: Byron Joseph Palla, Murphy, TX (US); Stephanie Leanne Hilbun, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/915,759

(22) Filed: Jun. 12, 2013

(65) Prior Publication Data

US 2013/0344624 A1    Dec. 26, 2013

Related U.S. Application Data

(60) Provisional application No. 61/659,651, filed on Jun. 14, 2012.

(51) Int. Cl.
*G06F 17/50* (2006.01)
(52) U.S. Cl.
USPC .................................. 716/51; 716/52; 716/54

(58) Field of Classification Search
USPC .............................................. 716/51, 52, 54
See application file for complete search history.

(56) References Cited

U.S. PATENT DOCUMENTS

| 6,112,130 | A  | * | 8/2000 | Fukuda et al. | 700/121 |
| 8,151,220 | B2 | * | 4/2012 | Hess et al. | 716/51 |
| 2009/0326996 | A1 | * | 12/2009 | Goh et al. | 705/7 |

* cited by examiner

*Primary Examiner* — Vuthe Siek
*Assistant Examiner* — Brian Ngo
(74) *Attorney, Agent, or Firm* — Jacqueline J. Garner; Wade J. Brady, III; Frederick J. Telecky, Jr.

(57) ABSTRACT

An integrated circuit is formed by identifying process parameters of a plurality of process steps for the first partial lot containing the integrated circuit; confirming the number of wafers in the first partial lot is less than the wafer carrier capacity; examining lots upstream of the partial lot and identifying a second partial lot which can be combined with the first partial lot into a single wafer carrier and which can be processed with the first partial lot; combining the wafers of the partial lots into a single wafer carrier; processing the partial lots through the plurality of process steps; and performing a multi-lot verification process. The multi-lot verification process determines if all wafers in the partial lots have completed the process step; determines if any wafers in the partial lots are on hold; and determining if all wafers in the partial lots are in a same material carrier.

10 Claims, 7 Drawing Sheets

SEMICONDUCTOR MANUFACTURING OPTIMIZATION BY COMBINING SMALL LOTS INTO INDIVIDUAL CARRIERS

CROSS-REFERENCE TO RELATED APPLICATIONS

This application claims the benefit of priority under U.S.C. §119(e) of U.S. Provisional Application 61/659,651 (filed Jun. 14, 2012).

FIELD OF THE INVENTION

This invention relates to the field of integrated circuits. More particularly, this invention relates to methods of forming integrated circuits.

BACKGROUND OF THE INVENTION

Integrated circuits may be fabricated on semiconductor wafers which are processed in lots. The wafers in a lot are commonly transported and stored in a wafer carrier with a capacity of, typically, 25 wafers. An integrated circuit fabrication line may run at a desired level of efficiency if all lots have a number of wafers equal to the capacity of the wafer carriers, that is, if the fabrication equipment is always processing full wafer carriers. However, frequently a lot may have fewer wafers than the capacity of the wafer carrier. Lots with fewer wafers than the wafer carrier capacity may come about because wafers are scrapped during the fabrication sequence, or because only a few wafers are needed to fill a customer order. Lots with fewer wafers than the wafer carrier capacity may cause inefficiency in the fabrication line, because some fabrication equipment cannot process partially filled wafer carriers at the same rate, in wafers per hour, as full wafer carriers.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit, which is formed on a wafer that is part of a first partial lot composed of fewer wafers than a wafer carrier capacity, is formed by a process including the steps: identifying process parameters of a plurality of sequential process steps for the first partial lot containing the to-be-formed integrated circuit; confirming the number of wafers in the first partial lot is less than the wafer carrier capacity; examining lots upstream of the plurality of sequential process steps and identifying at least one additional partial lot which can be combined with the first partial lot into a single wafer carrier and which can be processed with the first partial lot through the plurality of sequential process steps; combining the wafers of the first partial lot and the wafers of the at least additional partial lot into a single wafer carrier; processing the first partial lot and the at least additional partial lot through the plurality of sequential process steps using a single wafer carrier for each process step; and performing a multi-lot verification process after each process step of the plurality of sequential process steps.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit, which is formed on a wafer that is part of a first partial lot composed of fewer wafers than a wafer carrier capacity, is formed by a process including the steps: identifying process parameters of a plurality of process steps for the first partial lot containing the to-be-formed integrated circuit; confirming the number of wafers in the first partial lot is less than the wafer carrier capacity; examining lots upstream of the plurality of sequential process steps, that is lots which have not yet reached the plurality of sequential process steps, and identifying at least one additional partial lot which can be combined with the first partial lot into a single wafer carrier and which can be processed with the first partial lot through the plurality of process steps; combining the wafers of the first partial lot and the wafers of the at least one additional partial lot into a single wafer carrier; processing the first partial lot and the at least one additional partial lot through the plurality of process steps using a single wafer carrier for each process step; and performing a multi-lot verification process after each process step of the plurality of process steps. The multi-lot verification process includes the steps of: determining if all wafers in the first partial lot and the at least one additional partial lot have completed processing through the process step; determining if any wafers in the first partial lot and the at least one additional partial lot are on hold; and determining if all wafers in the first partial lot and the at least one additional partial lot are in a same wafer carrier.

A wafer carrier may have a capacity of, for example, 25 wafers. A wafer carrier is sometimes referred by other terms. For example, a wafer carrier for wafers up to 150 mm diameter is sometimes referred to as a wafer cassette. A wafer carrier for 200 mm wafers is sometimes referred to as a Standard Mechanical InterFace (SMIF) pod. A wafer carrier for 300 mm wafers is sometimes referred to as or a Front Opening Universal Pod or Front Opening Unified Pod (FOUP).

For the purposes of this disclosure, the term "process tool" refers to a piece of fabrication processing equipment. For example, process tool may be used to refer to a reactive ion etch (RIE) etcher, an ion implanter, a wet clean hood, metal sputtering equipment, an oxide growth furnace, a rapid thermal processor and a photolithographic printer.

A partial lot may have any number of wafers which is less than the wafer carrier capacity. For example, a partial lot being fabricated in a fabrication line using wafer carriers with a capacity of 25 wafers at a particular process step has 1 to 24 wafers. For the purposes of this disclosure, wafers of a partial lot may be said to have integrated circuits; it will be recognized that the integrated circuits are in the process of being formed.

Figure 1A:
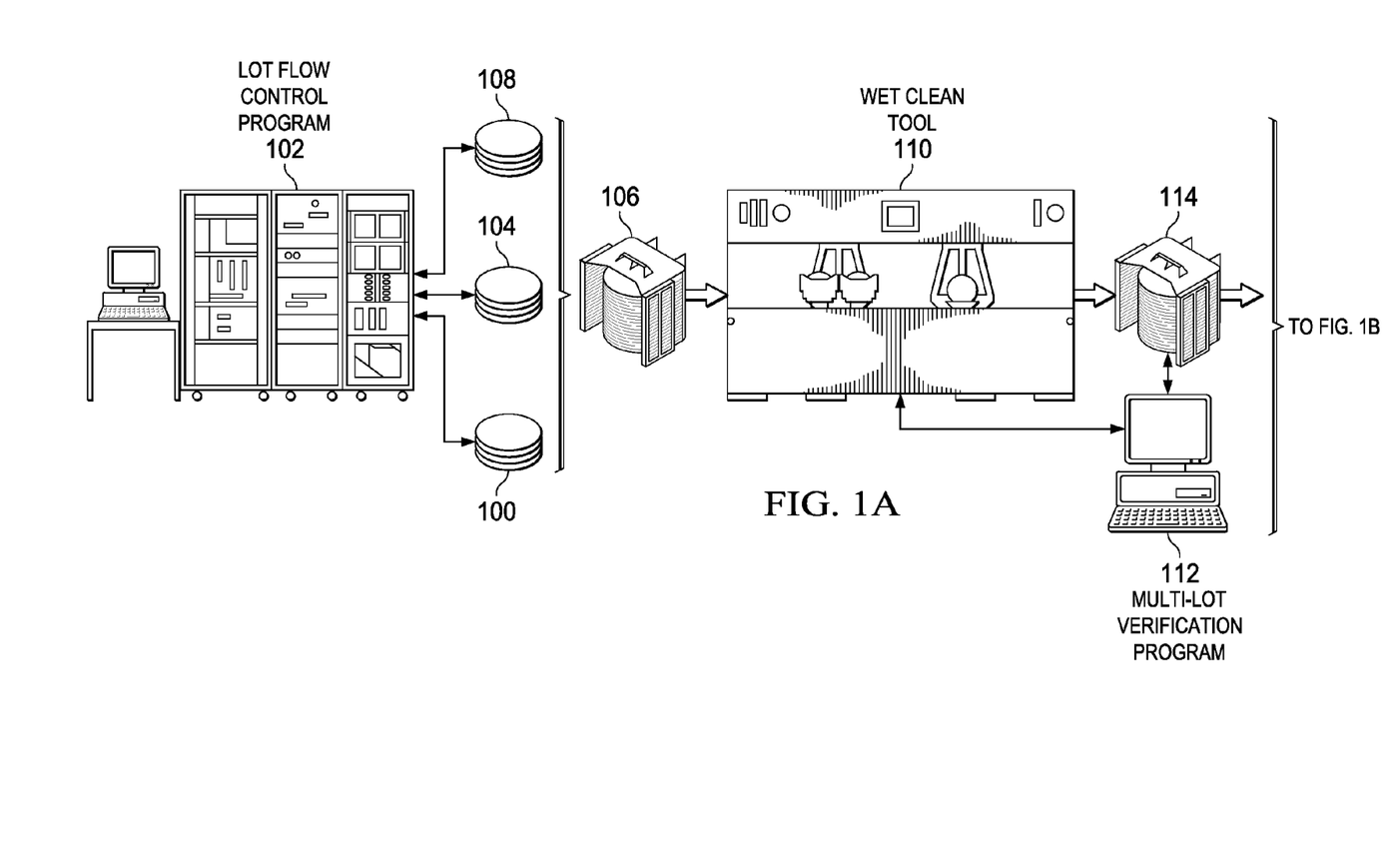
FIG. 1A through FIG. 1D are schematics of an exemplary process flow for a partial lot.

FIG. 1A through FIG. 1D are schematics of an exemplary process flow for an integrated circuit of a partial lot. Referring to FIG. 1A, a first partial lot 100 containing the integrated circuit arrives at a first process staging point, sometimes referred to as a bus stop, for a first plurality of sequential process steps of a fabrication sequence. A lot flow control program 102 is used to direct lot movement through the fabrication sequence. The lot flow control program 102 may be executed, for example, on a Unix workstation, a personal computer, or other computer system.

The lot flow control program 102 confirms that a number of wafers in the first partial lot 100 is less than a capacity of the wafer carriers used by process equipment at the first plurality of process steps. The lot flow control program 102 identifies values of process parameters of the first partial lot 100 for the first plurality of process steps. For example, the process parameters for a wet clean step may include concentrations of reagents, temperature, and immersion time. The process parameters for a furnace oxidation step may include temperature, gas flow rates and oxidation time. The process parameters for an RIE step may include chuck temperature, reactant gas flows, chamber pressure, power level, etch time, and/or overetch time. Process parameters for other types of process steps are known by those having skill in the art.

The lot flow control program 102 subsequently examines lots in the fabrication sequence, commonly referred to as work in process (WIP), and identifies a second partial lot 104 with values of the process parameters for the first plurality of process steps which are compatible with the values of the first partial lot 100 and which has a number of wafers which, when added to the number of wafers in the first partial lot 100, does not exceed the wafer carrier capacity. Process parameter values of the first partial lot 100 and process parameters values of the second partial lot 104 are compatible if the first partial lot 100 and the second partial lot 104 can be processed as one lot by the process equipment through the first plurality of process steps. The second partial lot 104 may not necessarily have integrated circuits of a same type or design or layout as the first partial lot 100. In one version of the instant embodiment, the lot flow control program 102 may perform some or all of these actions prior to arrival of the first partial lot 100 at the first process staging point.

The lot flow control program 102 subsequently directs that the wafers of the first partial lot 100 and the wafers of the second partial lot 104 to be combined in a first wafer carrier 106.

If the wafers in the first partial lot 100 and the wafers in the second partial lot 104 do not fill the first wafer carrier 106, the lot flow control program 102 may identify a third partial lot 108 with values of the process parameters for the first plurality of process steps which are compatible with the values of the first partial lot 100 and which has a number of wafers which, when added to the number of wafers in the first partial lot 100 and the second partial lot 104, does not exceed the wafer carrier capacity. If the third partial lot is identified, the lot flow control program 102 may subsequently direct that the wafers of the third partial lot 108 be combined with the wafers of the first partial lot 100 and the wafers of the second partial lot 104 in the first wafer carrier 106.

Subsequently, the first wafer carrier 106 is provided to a first process tool 110, for example a wet etch hood 110 as depicted in FIG. 1A for a wet clean process step, which performs a first process step of the first plurality of process steps. The first process tool 110 processes the wafers of the first partial lot 100, the second partial lot 104 and the third partial lot 108, if included, through the first process step of the first plurality of process steps. Wafer throughput of the first process step of the first plurality of process steps may be improved by combining the wafers of the first partial lot 100, the wafers of the second partial lot 104 and the wafers of the third partial lot 108 in the first wafer carrier 106. The wafers are placed into a second wafer carrier 114 upon completion of the first process step of the first plurality of process steps. In one version of the instant example, the second wafer carrier 114 may be the first wafer carrier 106.

A multi-lot verification program 112 is executed which determines if all the wafers in the first partial lot 100, the second partial lot 104 and the third partial lot 108, if included, have completed the first process step; the multi-lot verification program 112 may be executed on a Unix workstation, a personal computer, or other computer system, and may be executed on the same computer system as the lot flow control program 102. The multi-lot verification program 112 takes measures to disposition the wafers of the first partial lot 100, the second partial lot 104 and the third partial lot 108, if included, consistent with any maximum allowable wait time associated with the first process step.

The multi-lot verification program 112 also determines if any of the wafers of the first partial lot 100, the second partial lot 104 and the third partial lot 108, if included, are on hold. Wafers may be placed on hold for a variety of reasons, such as out of tolerance process parameter values, out of tolerance values from in-line statistical process control (SPC) tests, and/or defects found by inspection. If any of the wafers are on hold, the multi-lot verification program 112 takes measures to disposition the wafers, consistent with the maximum allowable wait time associated with the first process step.

The multi-lot verification program 112 subsequently determines if all the wafers of the first partial lot 100, the second partial lot 104 and the third partial lot 108, if included, are in the second wafer carrier 114. If any of the wafers have completed the first process step, are not on hold and are not in the second wafer carrier 114, the multi-lot verification program 112 takes measures to disposition the wafers, consistent with the maximum allowable wait time associated with the first process step, possibly including directing such wafers to be placed in the second wafer carrier 114.

Figure 1B:
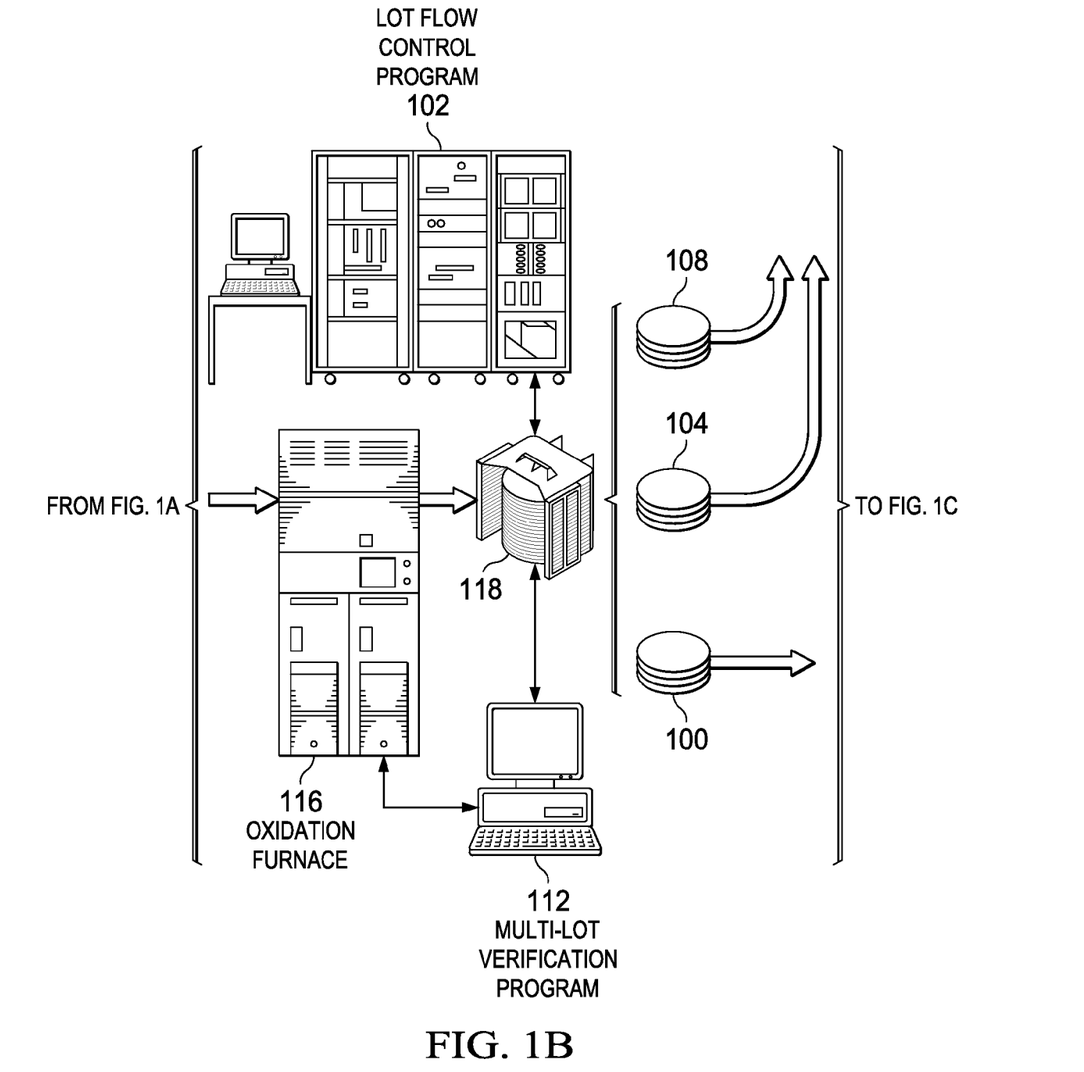

The exemplary process flow is continued with reference to FIG. 1B. The wafers of the first partial lot 100, the second partial lot 104 and the third partial lot 108 if included are as one lot through a second process step of the first plurality of process steps in a second process tool. The lot flow control program 102 confirmed that values of process parameters of the first partial lot 100, the second partial lot 104 and the third partial lot 108, if included, are compatible for the second process step while the wafers were at, or upstream of, the first process staging point.

The second wafer carrier 114 is then provided to a second process tool 116, for example an oxidation furnace 116 as depicted in FIG. 1B for a furnace oxidation process step, which performs the second process step. Lot cycle times for the first partial lot 100, the second partial lot 104 and the third partial lot 108, if included, may be improved by leaving the first partial lot 100, the second partial lot 104 and the third partial lot 108 in the second wafer carrier 114 for processing at the second process tool 116. The second process tool 116 processes the wafers of the first partial lot 100, the second partial lot 104 and the third partial lot 108, if included, through the second process step of the first plurality of process steps. Wafer throughput of the second process step may be improved by combining the wafers of the first partial lot 100, the wafers of the second partial lot 104 and the wafers of the third partial lot 108 in the second wafer carrier 114. The wafers are placed into a third wafer carrier 118 upon completion of the second process step of the first plurality of process steps. In one version of the instant example, the third wafer carrier 118 may be the second wafer carrier 114 or the first wafer carrier 106.

The multi-lot verification program 112 is executed which determines if all the wafers in the first partial lot 100, the second partial lot 104 and the third partial lot 108, if included, have completed the second process step, and takes appropriate actions, as described in reference to FIG. 1A. The multi-lot verification program 112 also determines if any of the wafers of the first partial lot 100, the second partial lot 104 and the third partial lot 108, if included, are on hold after processing through the second process step, and takes appropriate actions, as described in reference to FIG. 1A.

The multi-lot verification program 112 subsequently determines if all the wafers of the first partial lot 100, the second partial lot 104 and the third partial lot 108, if included, are in the third wafer carrier 118. If any of the wafers have completed the second process step, are not on hold and are not in the third wafer carrier 118, the multi-lot verification program 112 takes appropriate action, possibly directing such wafers to be placed in the third wafer carrier 118.

The wafers of the first partial lot 100, the second partial lot 104 and the third partial lot 108 if included are processed as one lot through remaining process steps of the first plurality of process steps, as described above. The multi-lot verification program 112 is executed after each process step of the first plurality of process steps. Subsequently, the lot flow control program 102 may direct that the wafers in the third wafer carrier 106 be separated back into the first partial lot 100, the second partial lot 104 and the third partial lot 108 if included. The separate partial lots 100, 104 and 108 may resume fabrication through the process sequence as separate lots; the partial lots may be recombined for processing at future process steps, and/or may be combined with other partial lots for processing at future process steps.

Figure 1C:
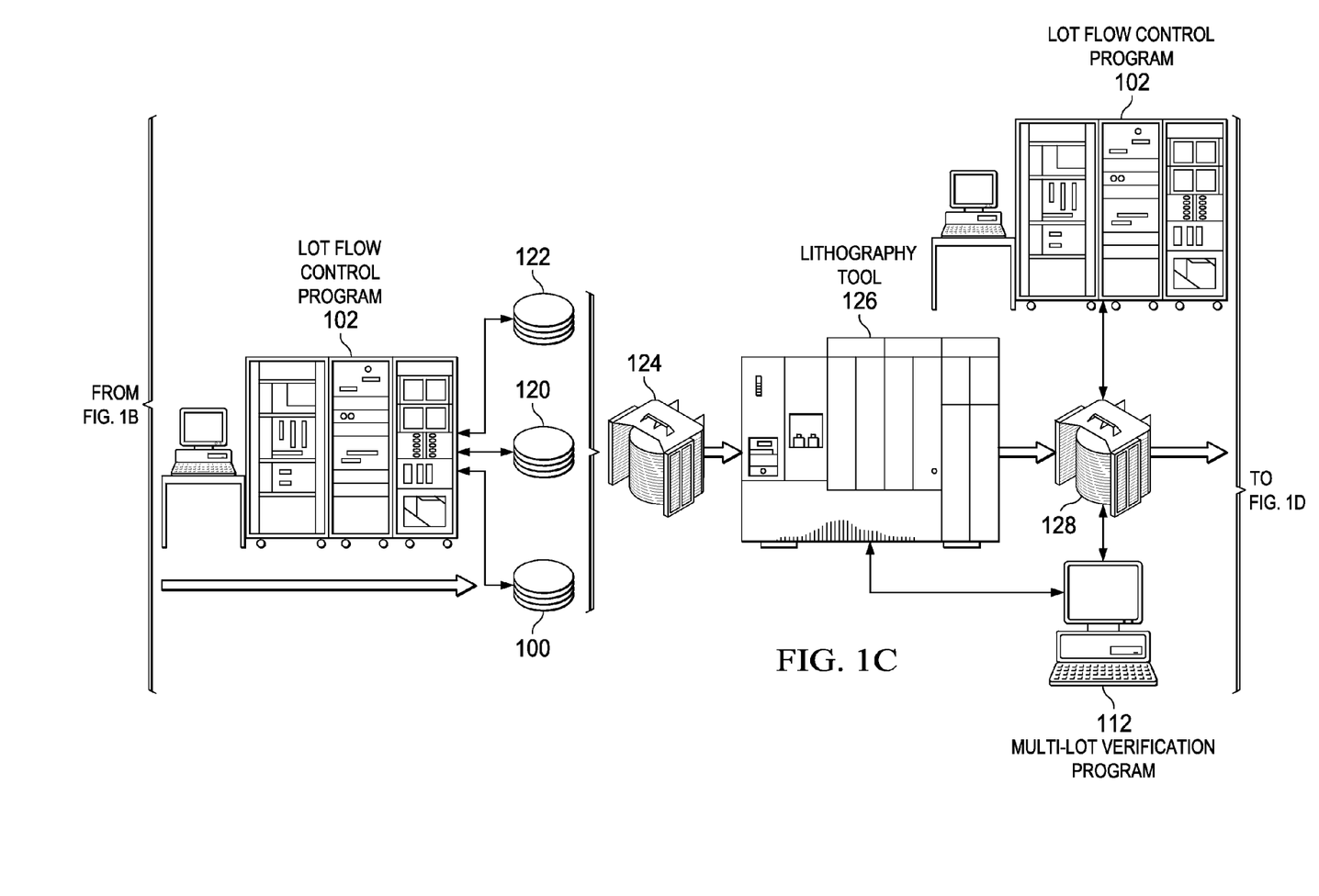

The exemplary process flow is continued with reference to FIG. 1C. The first partial lot 100 arrives at a second process staging point for a second plurality of sequential process steps. The lot flow control program 102 identifies values of process parameters of the first partial lot 100 for the second plurality of process steps. The lot flow control program 102 confirms that a number of wafers in the first partial lot 100 is less than a capacity of the wafer carriers used by process equipment at the third process step.

The lot flow control program 102 subsequently examines lots in WIP, and identifies a fourth partial lot 120 with values of the process parameters for the second plurality of process steps which are compatible with the values of the first partial lot 100 and which has a number of wafers which, when added to the number of wafers in the first partial lot 100, does not exceed the wafer carrier capacity. The fourth partial lot 120 may not necessarily have integrated circuits of a same type or design or layout as the first partial lot 100. The lot flow control program 102 may identify a fifth partial lot 122 with values of the process parameters for the plurality of process steps which are compatible with the values of the first partial lot 100 and which has a number of wafers which, when added to the number of wafers in the first partial lot 100 and the fourth partial lot 120, does not exceed the wafer carrier capacity. The lot flow control program 102 subsequently directs that the wafers of the first partial lot 100 and the wafers of the fourth partial lot 120 and the wafers of the fifth partial lot 122, if included, to be combined in a fourth wafer carrier 124.

Subsequently, the fourth wafer carrier 124 is provided to a third process tool 126, for example a projection printer 126 as depicted in FIG. 1C for a photolithography process step, which performs a first process step of the second plurality of process steps. The third process tool 126 processes the wafers of the first partial lot 100, the fourth partial lot 120 and the fifth partial lot 122, if included, through the third process step. Wafer throughput of the first process step of the second plurality of process steps may be improved by combining the wafers of the first partial lot 100, the wafers of the fourth partial lot 120 and the fifth partial lot 122 in the fourth wafer carrier 124. The wafers are placed into a fifth wafer carrier 128 upon completion of the first process step of the second plurality of process steps. In one version of the instant example, the fifth wafer carrier 128 may be the fourth wafer carrier 124.

The multi-lot verification program 112 is executed which determines if all the wafers in the first partial lot 100, the fourth partial lot 120 and the fifth partial lot 122, if included, have completed the first process step of the second plurality of process steps, determines if any of the wafers of the first partial lot 100, the fourth partial lot 120 and the fifth partial lot 122, if included, are on hold, and subsequently determines if all the wafers of the first partial lot 100, the fourth partial lot 120 and the fifth partial lot 122, if included, are in the fifth wafer carrier 128, as described in reference to FIG. 1A The exemplary process flow is continued with reference to FIG. 1D. The wafers of the first partial lot 100, the second partial lot 104 and the third partial lot 108 if included are as one lot through a second process step of the second plurality of process steps in a fourth process tool. The lot flow control program 102 confirmed that values of process parameters of the first partial lot 100, the fourth partial lot 120 and the fifth partial lot 122, if included, are compatible for the second process step while the wafers were at, or upstream of, the first process staging point.

Figure 1D:
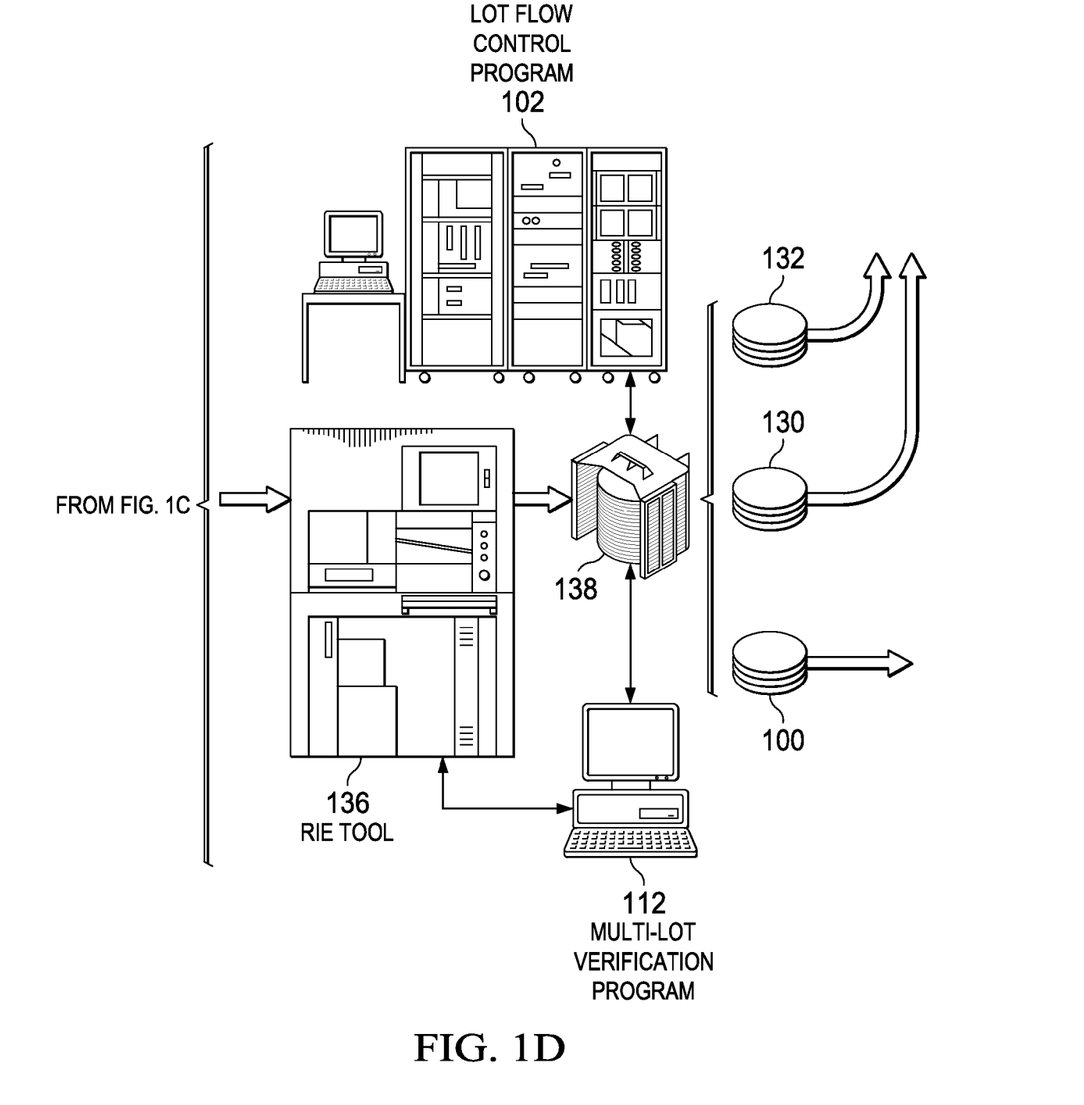

The fifth wafer carrier 128 is then provided to the fourth process tool 116, for example an RIE tool 136 as depicted in FIG. 1D for an RIE process step, which performs the second process step of the second plurality of process steps. Lot cycle times for the first partial lot 100, the fourth partial lot 120 and the fifth partial lot 122, if included, may be improved by leaving the first partial lot 100, the fourth partial lot 120 and the fifth partial lot 122 in the fifth wafer carrier 128 for processing at the fourth process tool 136. The fourth process tool 136 processes the wafers of the first partial lot 100, the fourth partial lot 120 and the fifth partial lot 122, if included, through the second process step of the second plurality of process steps. Wafer throughput of the second process step may be improved by combining the wafers of the first partial lot 100, the wafers of the fourth partial lot 120 and the wafers of the fifth partial lot 122 in the fifth wafer carrier 128. The wafers are placed into a sixth wafer carrier 138 upon completion of the second process step of the second plurality of process steps. In one version of the instant example, the sixth wafer carrier 138 may be the fifth wafer carrier 128 or the fourth wafer carrier 124.

The multi-lot verification program 112 is executed which determines if all the wafers in the first partial lot 100, the fourth partial lot 120 and the fifth partial lot 122, if included, have completed the second process step of the second plurality of process steps, and takes appropriate actions, as described in reference to FIG. 1A. The multi-lot verification program 112 also determines if any of the wafers of the first partial lot 100, the fourth partial lot 120 and the fifth partial lot 122, if included, are on hold after processing through the second process step of the second plurality of process steps, and takes appropriate actions, as described in reference to FIG. 1A.

The multi-lot verification program 112 subsequently determines if all the wafers of the first partial lot 100, the fourth partial lot 120 and the fifth partial lot 122, if included, are in the sixth wafer carrier 138. If any of the wafers have completed the second process step of the second plurality of process steps, are not on hold and are not in the sixth wafer carrier 138, the multi-lot verification program 112 takes appropriate action, possibly directing such wafers to be placed in the sixth wafer carrier 138.

The wafers of the first partial lot 100, the fourth partial lot 120 and the fifth partial lot 122 if included are processed as one lot through remaining process steps of the second plurality of process steps, as described above. The multi-lot verification program 112 is executed after each process step of the second plurality of process steps. Subsequently, the lot flow control program 102 may direct that the wafers in the third wafer carrier 106 be separated back into the first partial lot 100, the fourth partial lot 120 and the fifth partial lot 122 if included. The separate partial lots 100, 120 and 122 may resume fabrication through the process sequence as separate lots; the partial lots may be recombined for processing at future process steps, and/or may be combined with other partial lots for processing at future process steps.

It will be recognized that the first plurality of sequential process steps and/or the second plurality of sequential process steps may further include a metal sputter process step, an ion implant process step, a dielectric layer formation process step, a metal organic chemical vapor deposition process step, a metal layer electroplating process step, a furnace anneal process step, and/or other process steps used for fabrication of the integrated circuit.

Figure 2:
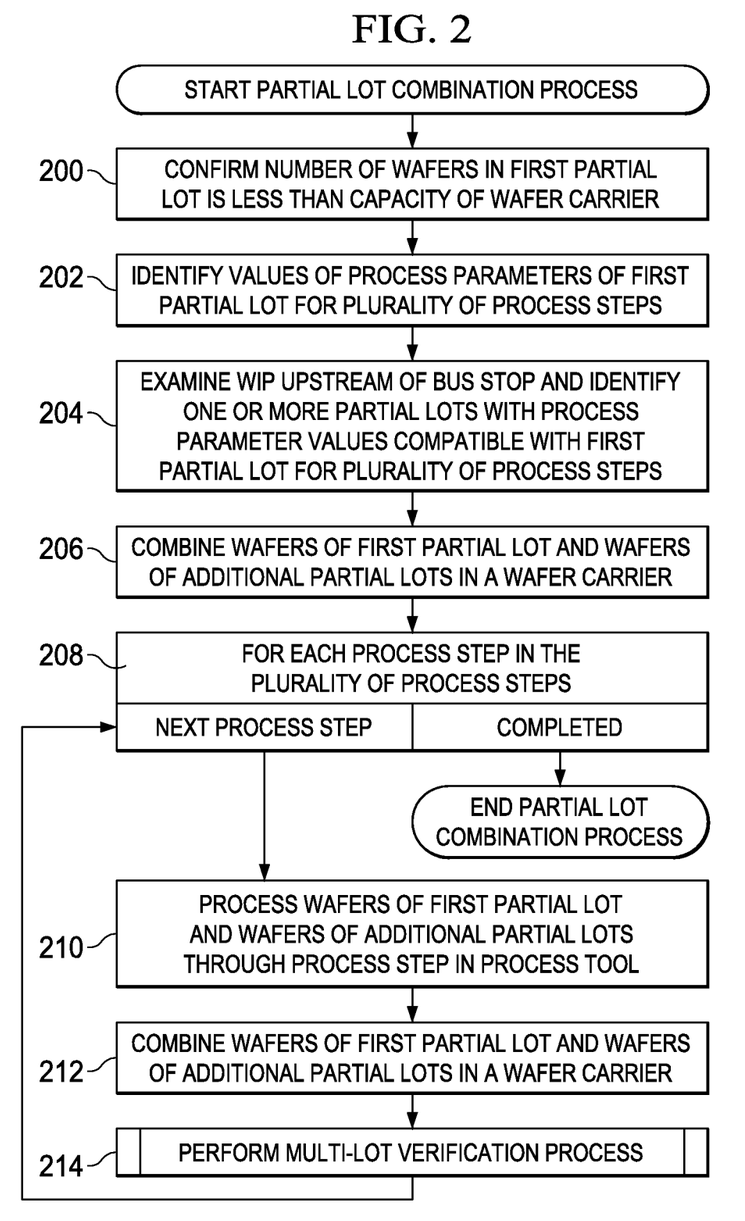
FIG. 2 is a flowchart of the partial lot combination process described in reference to FIG. 1A through FIG. 1D.

FIG. 2 is a flowchart of the partial lot combination process described in reference to FIG. 1A through FIG. 1D. The process starts with step 200 in which the lot flow control program confirms that the number of wafers in a first partial lot is less than a capacity of wafer carriers used by process tools for a plurality of process steps.

In step 202 the lot flow control program identifies the values of the process parameters of the first partial lot for the plurality of process steps. It will be recognized that steps 200 and 202 may be performed in any order, or concurrently.

In step 204 lot flow control program examines lots in WIP and identifies one or more additional partial lots upstream of the plurality of process steps with values of the process parameters for the plurality of process steps which are compatible with the values of the first partial lot and which have a number of wafers which, when added to the number of wafers in the first partial lot, does not exceed the wafer carrier capacity.

In step 206 the wafers of the first partial lot and the additional partial lots are combined in one wafer carrier. A temporary lot number may optionally be assigned to the combined partial lots.

In step 208 the wafers of the partial lots are iterated through the process steps of the plurality of process steps. Each iteration includes step 210, step 212 and step 214.

In step 210 the wafers of the partial lots are provided in one wafer carrier to a process tool of the instant process step, which processes the wafers through the instant process step.

In step 212, as the wafers complete the instant process step, the wafers are placed in one wafer carrier.

In step 214 the multi-lot verification program is executed. Steps of the multi-lot verification program are discussed in reference to FIG. 3.

When all the process steps of the plurality of process steps have been completed in the iteration step 208, the partial lot combination process is ended.

Figure 3A:
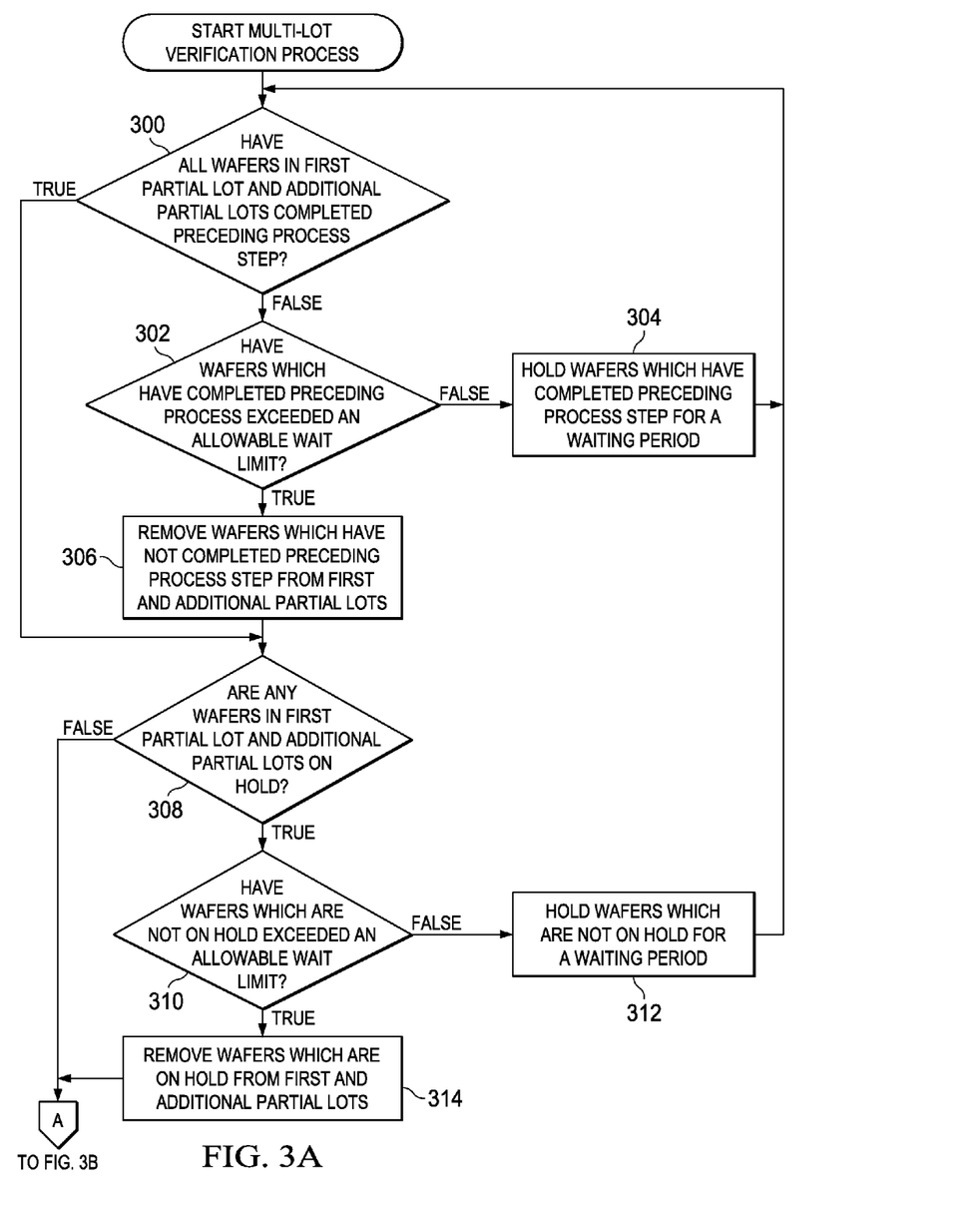
FIG. 3A and FIG. 3B are a flowchart of the multi-lot verification process referred to reference to FIG. 2 and described in reference to FIG. 1A through FIG. 1D.
Figure 3B:
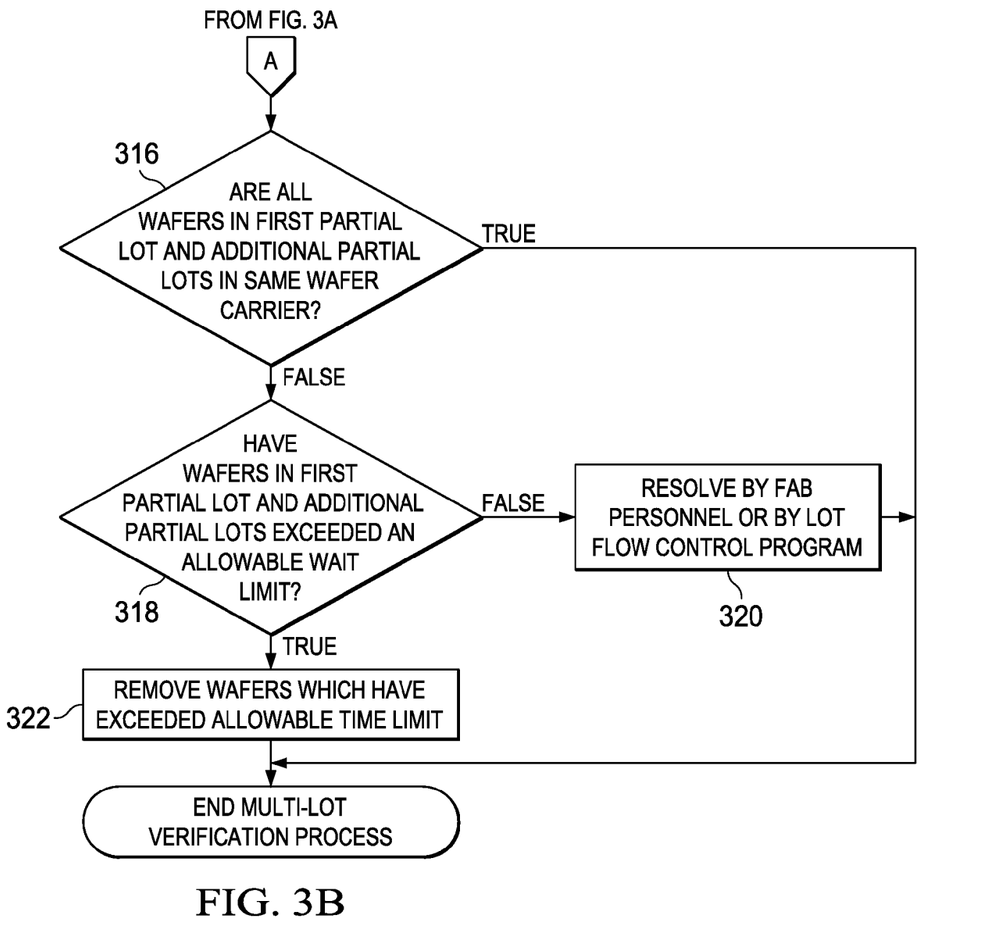

FIG. 3A and FIG. 3B contain a flowchart of the multi-lot verification process referred to in step 214 in reference to FIG. 2 and described in reference to FIG. 1A through FIG. 1D. The process starts with decision step 300 in which the multi-lot verification program determines if all wafers in the partial lots have completed the process step described in step 210. If a FALSE result from decision step 300 is obtained, decision step 302 is executed, in which the multi-lot verification process determines if the wafers of the partial lots which have completed the process step have exceeded a maximum allowable wait time associated with the process step. If a FALSE result from decision step 302 is obtained, step 304 is executed in which the wafers which have completed the process step may be held an additional time period while waiting for more wafers of the partial lots to complete the process step; following execution of step 304, execution of the multi-lot verification process is transferred back to step 300. If a TRUE result from decision step 302 is obtained, the wafers of the partial lots which have not completed the process step are removed from the partial lots, and execution of the multi-lot verification process is transferred to decision step 308. If a TRUE result from decision step 300 is obtained, execution of the multi-lot verification process is transferred to decision step 308.

In decision step 308 the multi-lot verification program determines if any wafers in the partial lots are on hold. If a TRUE result from decision step 308 is obtained, decision step 310 is executed, in which the multi-lot verification process determines if the wafers of the partial lots which have completed the process step have exceeded a maximum allowable wait time associated with the process step. If a FALSE result from decision step 310 is obtained, step 312 is executed in which the wafers which are not on hold may be held an additional time period while waiting for more wafers of the partial lots to be released from hold; following execution of step 312, execution of the multi-lot verification process is transferred back to step 300. If a TRUE result from decision step 310 is obtained, step 314 is executed in which the wafers of the partial lots which are on hold are removed from the partial lots, and execution of the multi-lot verification process is transferred to decision step 316. If a FALSE result from decision step 308 is obtained, execution of the multi-lot verification process is transferred to decision step 316.

In decision step 316 the multi-lot verification program determines if all the wafers in the partial lots are in the same wafer carrier, for example wafer carrier 114 of FIG. 1A, wafer carrier 118 of FIG. 1B, wafer carrier 128 of FIG. 1C or wafer carrier 138 of FIG. 1D. If a FALSE result from decision step 316 is obtained, decision step 318 is executed, in which the multi-lot verification process determines if the wafers of the partial lots which have completed the process step have exceeded a maximum allowable wait time associated with the process step. If a FALSE result from decision step 318 is obtained, step 320 is executed in which the situation of the wafers in the partial lots not being in the same wafer carrier is resolved, for example by fab personnel or by the lot flow control program. After step 320 is completed, the multi-lot verification process is completed. If a TRUE result from decision step 318 is obtained, step 322 is executed in which wafers of the partial lots which are not in the same wafer carrier are removed from the partial lots, and the multi-lot verification process is completed. If a TRUE result from decision step 316 is obtained, the multi-lot verification process is completed.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising the steps of:
   executing a lot flow control program on a first computer system, said lot flow control program performing the steps of:
   confirming that a number of wafers in a first partial lot is less than a capacity of wafer carriers used by process tools for a first plurality of sequential process steps;
   identifying values of process parameters of said first partial lot for said first plurality of sequential process steps; and
   examining lots in work in process (WIP) upstream of said first plurality of sequential process steps and identifying a second partial lot with values of said process parameters which are compatible with said values of said process parameters of said first partial lot;
   combining said wafers of said first partial lot and said second partial lot in a first wafer carrier; and
   iterating through each instant process step of said first plurality of said sequential process steps, wherein each iteration comprises the steps of:
   processing said wafers of said first partial lot and said second partial lot through said instant process step;
   placing said wafers of said first partial lot and said second partial lot into a same wafer carrier as each said wafer completes said instant process step; and
   executing a multi-lot verification program on a second computer system, said multi-lot verification program performing the steps of:
   determining if all of said wafers in said first partial lot and said second partial lot have completed said instant process step;
   determining if any of said wafers in said first partial lot and said second partial lot are on hold; and
   determining if all of said wafers in said first partial lot and said second partial lot are in said same wafer carrier.

2. The method of claim 1, in which a FALSE result is obtained from said step of determining if all of said wafers in said first partial lot and said second partial lot have completed said process step, and subsequently determining if said wafers in said first partial lot and said second partial lot which have completed said process step have exceeded a maximum allowable wait time associated with said process step.

3. The method of claim 1, in which a TRUE result is obtained from said step of determining if any of said wafers in said first partial lot and said second partial lot are on hold, and subsequently determining if said wafers in said first partial lot and said second partial lot which are not on hold have exceeded a maximum allowable wait time associated with said process step.

4. The method of claim 1, in which a FALSE result is obtained from said step of determining if all of said wafers in said first partial lot and said second partial lot are in said same wafer carrier, and subsequently transferring said wafers in said first partial lot and said second partial lot which are not in said same wafer carrier into said same wafer carrier.

5. The method of claim 1, in which said first plurality of sequential process steps includes a wet clean process step.

6. The method of claim 1, in which said first plurality of sequential process steps includes a furnace oxidation process step.

7. The method of claim 1, in which said first plurality of sequential process steps includes a photolithography process step.

8. The method of claim 1, in which said first plurality of sequential process steps includes a reactive ion etch (RIE) process step.

9. The method of claim 1, in which:
   said wafers of said first partial lot and said wafers of said second partial lot do not fill said first wafer carrier;
   said step of executing said lot flow control program further includes examining said lots in WIP upstream of said first plurality of sequential process steps and identifying a third partial lot with values of said process parameters which are compatible with said values of said process parameters of said first partial lot;
   said step of combining said wafers of said first partial lot and said second partial lot in said first wafer carrier includes combining said wafers of said third partial lot in said first wafer carrier;
   said step of processing said wafers of said first partial lot and said second partial lot through said instant process step includes processing said wafers of said third partial lot through said instant process step;
   said step of placing said wafers of said first partial lot and said second partial lot into said same wafer carrier includes placing said wafers of said third partial lot into said same wafer carrier as each said wafer completes said instant process step;
   said step of determining if all of said wafers in said first partial lot and said second partial lot have completed said instant process step includes determining if all of said wafers in said third partial lot have completed said instant process step;
   said step of determining if any of said wafers in said first partial lot and said second partial lot are on hold includes determining if any of said wafers in said third partial lot are on hold; and
   said step of determining if all of said wafers in said first partial lot and said second partial lot are in said same wafer carrier includes determining if all of said wafers in said third partial lot are in said same wafer carrier.

10. The method of claim 1, including the steps of:
    executing said lot flow control program so as to perform the steps of:

identifying values of process parameters of said first partial lot for a second plurality of sequential process steps; and examining lots in WIP upstream of said second plurality of sequential process steps and identifying a third partial lot with values of said process parameters which are compatible with said values of said process parameters of said first partial lot for said second plurality of sequential process steps;

combining said wafers of said first partial lot and said third partial lot in a second wafer carrier; and iterating through each instant process step of said second plurality of said sequential process steps, wherein each iteration comprises the steps of:

processing said wafers of said first partial lot and said third partial lot through said instant process step;

placing said wafers of said first partial lot and said third partial lot into a same wafer carrier as each said wafer completes said instant process step; and executing said multi-lot verification program, said multi-lot verification program performing the steps of:

determining if all of said wafers in said first partial lot and said third partial lot have completed said instant process step;

determining if any of said wafers in said first partial lot and said third partial lot are on hold; and determining if all of said wafers in said first partial lot and said third partial lot are in said same wafer carrier.

\* \* \* \* \*